US011152281B2

(12) United States Patent
Collin et al.

(10) Patent No.: US 11,152,281 B2
(45) Date of Patent: Oct. 19, 2021

(54) METHOD OF MANUFACTURING A COOLING CIRCUIT ON AN INTEGRATED CIRCUIT CHIP USING A SACRIFICIAL MATERIAL

(71) Applicant: Commissariat A L'Energie Atomique et aux Energies Alternatives, Paris (FR)

(72) Inventors: Louis-Michel Collin, Grenoble (FR); Jean-Philippe Colonna, Grenoble (FR); Perceval Coudrain, Grenoble (FR); Luc Frechette, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 21 days.

(21) Appl. No.: 16/675,339

(22) Filed: Nov. 6, 2019

(65) Prior Publication Data

US 2020/0144152 A1    May 7, 2020

(30) Foreign Application Priority Data

Nov. 7, 2018  (FR) ...................................... 18 60240

(51) Int. Cl.
*H01L 23/367* (2006.01)
*H01L 21/56* (2006.01)
*H01L 23/473* (2006.01)

(52) U.S. Cl.
CPC ........ *H01L 23/3675* (2013.01); *H01L 21/568* (2013.01); *H01L 23/473* (2013.01); *H01L 2924/0105* (2013.01); *H01L 2924/01047* (2013.01)

(58) Field of Classification Search
CPC .................................................. H01L 23/3675
USPC ........................................................... 257/713
See application file for complete search history.

(56) References Cited

U.S. PATENT DOCUMENTS

| 5,317,805 | A | * | 6/1994 | Hoopman | ............... | B23P 15/26 |
| | | | | | | 257/E23.098 |
| 6,919,231 | B1 | | 7/2005 | Ramanathan et al. | | |
| 9,589,874 | B2 | | 3/2017 | Collin et al. | | |
| 2002/0140069 | A1 | * | 10/2002 | Lee | ......................... | H01L 24/13 |
| | | | | | | 257/678 |

(Continued)

FOREIGN PATENT DOCUMENTS

WO    WO 2012/005706 A1    1/2012

OTHER PUBLICATIONS

French Preliminary Search Report dated Sep. 23, 2019 in French Application 18 60240 filed on Nov. 7, 2018 (with English Translation of Categories of Cited Documents).

(Continued)

*Primary Examiner* — Ajay Arora
(74) *Attorney, Agent, or Firm* — Oblon, McClelland, Maier & Neustadt, L.L.P.

(57) ABSTRACT

A method for manufacturing a cooling circuit on at least one integrated circuit chip includes producing a cooling circuit on a first face of the chip. Producing the cooling circuit includes forming a definition pattern of the cooling circuit on the first face of the chip, the pattern having at least one layer of a sacrificial material; coating the pattern with at least one resin layer; and at least partially removing the sacrificial material from the pattern so as to open the cooling circuit.

14 Claims, 6 Drawing Sheets

(56) References Cited

U.S. PATENT DOCUMENTS

| | | | |
|---|---|---|---|
| 2004/0113283 A1* | 6/2004 | Farnworth | H01L 21/6835 |
| | | | 257/782 |
| 2005/0215058 A1 | 9/2005 | Ramanathan et al. | |
| 2008/0185714 A1 | 8/2008 | Ramanathan et al. | |
| 2013/0105135 A1* | 5/2013 | Kulah | F28F 21/00 |
| | | | 165/185 |
| 2014/0227147 A1 | 8/2014 | Beyer et al. | |
| 2016/0172278 A1* | 6/2016 | Collin | H01L 23/42 |
| | | | 257/675 |
| 2017/0133297 A1 | 5/2017 | Collin et al. | |
| 2017/0149405 A1* | 5/2017 | Kishimoto | H03H 3/02 |

OTHER PUBLICATIONS

De Boer, M. J, et al., "Micromachining of buried micro channels in silicon", IEEE, Journal of Microelectromechanical Systems, vol. 9, Issue 1, Mar. 2000 (English Abstract Only).

Vafaie, R. H, et al., "An Electroosmotically-driven Micromixer Modified for High Miniaturized Microchannels Using Surface Micromachining", Biotechnology and Bioprocess Engineering, vol. 18, 2013, pp. 594-605.

Jin, J, et al., "Nano/microchannel fabrication based on SU-8 using sacrificial resist etching method", The Institution of Engineering and Technology, Micro & Nano Letters, vol. 7, Issue 12, 2012, pp. 1320-1323.

Lee, J. R, et al., "Microchannels with rectangular and arched core shapes fabricated using sacrificial etching", J. Micro/Nanolith. MEMS MOEMS, vol. 6(1), 013010, 2007, 7 pages.

* cited by examiner

METHOD OF MANUFACTURING A COOLING CIRCUIT ON AN INTEGRATED CIRCUIT CHIP USING A SACRIFICIAL MATERIAL

FIELD OF THE INVENTION

The present invention relates to microelectronic devices and the manufacture thereof. A microelectronic device is understood herein to mean any type of device made using microelectronic means. In addition to devices intended for purely electronic purposes, said devices in particular include micromechanical or electromechanical devices (MEMS, NEMS, etc.) as well as optical or optoelectronic devices (MOEMS, etc.).

It particularly relates to the cooling of integrated circuit chips forming or comprised within such devices. In particularly, the invention allows for the creation of a cooling circuit, which circuit can be used in conjunction with a heat transfer fluid.

TECHNOLOGICAL BACKGROUND

Electronic circuits generate heat energy which must be dissipated. Certain components are low-power components and the heat can escape via the electrical connection elements which are good heat conductors, such as connection members, for example pads of printed circuit boards (PCB). For more high-power components, fin heat sinks are often used, procuring a larger heat exchange surface at the rear of the components. The remainder of the chips is generally coated in a resin layer used to encapsulate and protect the chip.

Moreover, the patent publication FR3030112 A1 discloses a method for manufacturing an assembly between a chip and a support plate, this method comprising producing metal walls defining channels, followed by depositing sacrificial resin between the metal walls, then assembling the chip and the plate, these steps being carried out such that the channels have closed sections defined by the walls and the opposing faces of the chip and the plate. The resin is then removed and the channels are subsequently open. Cooling is permitted through the channels, however at the cost of a relatively complex method (in particular due to the metal walls) that is closely connected to the assembly phase of the chip and the plate.

The patent publication WO 2012/005706 A1 discloses a cooling circuit on the surface of a microelectronic system. It uses side walls formed by electrodeposition delimiting a space for the integration of a sacrificial material and intended to form cooling channels.

There is currently thus a need for an alternative method for producing cooling channels for a chip.

One of the purposes of the invention is to at least partially overcome the drawbacks of the current techniques in order to fulfil this need.

SUMMARY OF THE INVENTION

One non-limiting aspect of the invention relates to a method for manufacturing a cooling circuit on at least one integrated circuit chip, comprising producing a cooling circuit on a first face of the chip.

Advantageously, the method is characterised in that the production of the cooling circuit comprises:

forming a definition pattern of the cooling circuit located at least partially on the first face of the chip, said pattern comprising at least one layer of a sacrificial material;
forming a coating of said pattern by at least one resin layer; and
at least partially removing the sacrificial material from said pattern so as to open the cooling circuit.

Another separable aspect of the present invention relates to a microelectronic device comprising at least one integrated circuit chip, a cooling circuit and a support.

Advantageously, this device is such that the cooling circuit is located on a first face of the chip, the chip being assembled via a second face of the chip, opposite the first face of the chip, to a first face of the support, the walls of the cooling circuit being defined, for a first of the walls, by the first face of the chip, and for the other walls, by channels formed in a resin coating.

Preferably, this device is obtained by the method of the invention.

Thus, the channels of the cooling circuit are defined in the coating resin. This significantly simplifies the manufacture thereof, in particular avoiding the need for complex lithography and etching steps. Moreover, the coating is preferably that which is used to package the chip, i.e. to form a package at least partially surrounding same. It is therefore not an additional part in this case.

Whereas the current technique tends towards solutions involving the dissipation of heat essentially via the materials of the chip, in particular silicon or metals, since they are good heat conductors, the invention adopts an alternative approach with the use of the coating resin. It goes without saying that this material is less effective, from a thermal perspective, however channels having a large section can be formed where necessary; and channel walls made of good thermally-conductive materials can still be used, such as the top wall of the chip, which is generally silicon-based, or such as, in a non-limiting case, a lining on the resin wall of the channels.

The opening of the cooling circuit, by removal of the sacrificial material, allows for fluid circulation within the circuit between two apertures of this circuit. This removal, which is advantageously carried out by melting or dissolution, is simple and uses the necessary apertures of the cooling circuit, which apertures are thus used both during manufacture (to remove the sacrificial material) and during cooling (to allow a coolant to enter and drain).

Another separable aspect of the invention is an embodiment wherein the manufacture of the cooling circuit is collective, that is to say it is carried out on the basis of a support common to a plurality of chips; the chip singularisation phase preferably simultaneously produces an access to the apertures of each circuit, thus significantly simplifying the production steps.

BRIEF DESCRIPTION OF THE FIGURES

Other features, purposes and advantages of this invention will be more clearly understood upon reading the following detailed description with reference to the accompanying figures, provided as non-limiting examples only and in which.

The drawings are provided by way of example and are not intended to limit the scope of the invention.

They constitute diagrammatic views intended to ease the understanding of the invention and are not necessarily to the scale of practical applications. In particular, the relative thicknesses of the layers are not representative of reality.

DETAILED DESCRIPTION

Before providing the detailed description of possible embodiments of the invention, the options that the invention can comprise are listed hereinbelow, these options being provided for information purposes only and are not limiting in nature, which options can be implemented individually or according to any combination therebetween:

- the removal comprises melting or dissolution of the sacrificial material;
- the cooling circuit 2 comprises a first aperture 21 and a second aperture 22, removal comprising an injection of a fluid via the first aperture 21 and an expulsion of the sacrificial material via the second aperture 22;
- the method comprises the formation of at least one first opening through the coating 6 configured so as to form an access (for fluid intake) to the pattern 4, the removal comprising an injection of a fluid via the at least one first opening, and/or the method comprises the formation of at least one second opening through the coating 6 configured so as to form an access (for fluid output) to the pattern 4, the removal comprising an expulsion of the sacrificial material via the at least one second opening; in such a case, the openings in question are advantageously separate from the apertures of the cooling circuit. There can be a plurality of first openings and/or a plurality of second openings; different types of openings can be combined: some (at least one) can be solely dedicated to injection or removal, with openings (at least one) produced by an aperture of the cooling circuit; more specifically, such an aperture is a specific mode of opening in the broad sense for the injection and/or removal steps. At least one first or second opening can be re-closed after the injection or removal respectively.
- the formation of said pattern comprises the formation of the at least one layer of a sacrificial material 42 on the first face of the chip, then the formation of at least one second layer 43 on the at least one layer of sacrificial material 42, the at least one second layer 43 being configured such that it is not removed during the removal of the sacrificial material;
- the formation of said pattern comprises the formation of at least one preliminary layer on the first face 10 of the chip 1, then the formation of the at least one layer of a sacrificial material 42 on the preliminary layer, the at least one preliminary layer being configured such that it is not removed during the removal of the sacrificial material;
- the method comprises assembling the chip, via a second face of the chip opposite the first face of the chip, on a first face 30 of a support 3 before producing the cooling circuit;
- a formation of an overlay layer on the first face 30 of the support 3 configured such that only the first face 10 of the chip 1 is left exposed;
- the formation of said pattern comprises the formation of a first pattern portion 40 on the first face of the chip 1 and the formation of a second pattern portion 41 on an area adjacent to the first face of the chip 1, in particular on the exposed face of the overlay layer 5;
- the assembly on the first face 30 of the support 3 and the cooling circuit are carried out for a plurality of chips 1;
- the formation of the second pattern portion 41 is configured so as to connect the two first pattern portions associated with different chips 1 of the plurality of chips 1;
- a separation of portions of the support each comprising at least one chip 1 of the plurality of chips, after formation of the coating 6 and before removal of the sacrificial material;
- the separation is configured so as to cut the second pattern portions so as to produce the first aperture 21 and/or the second aperture 22 of at least one chip 1 of the plurality of chips.

It is specified that, within the scope of the present invention, the terms "on" or "above" do not necessarily mean "in contact with". Thus, for example, the deposition of a layer on another layer does not necessarily mean that the two layers are directly in contact with one another, but rather means that one of the layers overlays at least partially the other while being either directly in contact therewith, or while being separated therefrom by a film, or even by another layer or by another element. Moreover, a layer can be constituted by a plurality of sub-layers made of the same material or made of different materials.

It is specified that, within the scope of the present invention, the thickness of a layer or of the chip substrate, or of the support, is measured in a direction perpendicular to the surface along which lies the maximum extension of this layer, of this substrate, or of this support. A lateral direction is understood to be directed perpendicularly to the thickness.

Unless stipulated otherwise, the features described with reference to one embodiment of the invention can be used in other embodiments.

Before providing the description corresponding to the embodiments presented in the figures, it is specified that the invention can be used in different contexts. More specifically, the invention can be implemented for chips collectively disposed on a substrate plate, generally referred to as a wafer, before conventional dicing and packaging of the chips; it can also be implemented on an individual scale for each chip. The invention further applies to structures of microelectronic devices that are more complex than individual chips, in particular for stacks of components on a support, for example of the printed circuit board (PCB) type; in this context, the zone in which the cooling circuit is created by channels defined in resin can be located, for example, in an interstitial space between the board and an upper level of the entire system, or on the top face of the system itself. In another case of a complex system, a plurality of chips can be packaged in a single resin package then fixed to a connection plate, for example of the PCB type. In particular, the packaging technique known as "3D fan-out packaging" falls within the scope of the invention insofar as it has relatively large volumes of resin coating which are favourable for the application of the invention.

To summarise, in general, the invention relates, on the one hand, to the collective manufacturing of chips, and on the other hand to individual manufacturing phases. Moreover, the invention relates as much to final microelectronic devices only including a single chip as it does to more complex devices including an association of juxtaposed and/or superimposed chips and/or an association of at least one chip with other components, for example a printed circuit board, an electrical connection base or an interposer.

The invention allows a cooling circuit to be defined. This definition is understood to mean that the form and location of the circuit (in particular the channels) are determined at certain locations and in particular at the cavities in a resin coating, and facing one face of the chip. This definition of a circuit in the form of a cavity (hollows in the coating and facing the chip) does not prohibit one or more of the layers from overlaying, at the circuit, the coating resin and/or the face of the chip.

One aspect of the invention involves using a polymer material, i.e. a resin, to define the contour of the whole part of the cooling circuit above the first face of the chip. Thus, the coating has a three-dimensional shape, with a wall forming a raised portion projecting onto the first face of the chip 1 and a wall closing the channels of the cooling circuit, via the top side thereof, opposite the face of the chip. Even though the walls of the cooling circuit can be overlaid with other materials, they are thus structurally defined by a casing made entirely by the resin layer, above the first face of the chip, including in the direction of the height of the circuit, corresponding to a thickness dimension of the substrate and to a dimension perpendicular to the first face of the chip. There is thus no need to use vertical channel walls produced by metal electrodeposition according to existing technologies.

Figure 1:
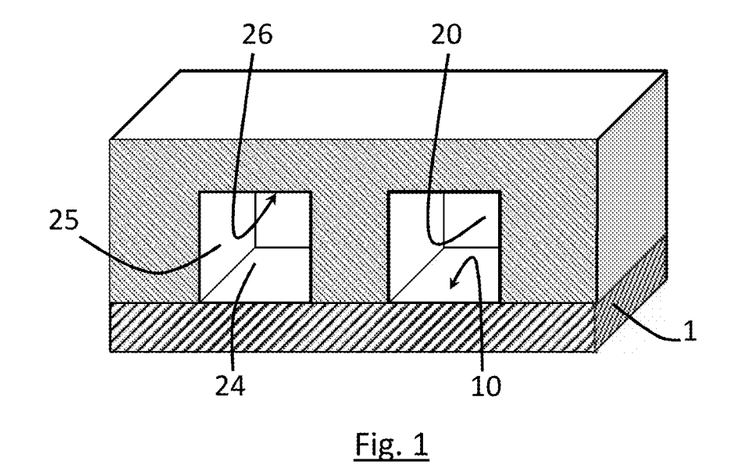
FIG. 1 is a diagrammatic view of two channels that can be formed on the surface of a chip in order to constitute a part of a cooling circuit.

FIG. 1 shows a partial view of the constitution of channels 20 that can be used to create a cooling circuit above a first face 10 of a chip 1. The invention does not make any assumptions as regards the technologies of the chips 1. In particular, the latter will advantageously have a base formed by materials of the semiconductor type, and are for example silicon-based. The first face 10 of the chip will typically be that opposite an electrical connection face having electrical connection elements. The first face 10 is shown in a planar and homogeneous manner, however this example is not limiting; it can be an electrically insulating portion that is nonetheless a good thermal conductor; in particular, heat sinks can be present in this location.

Figure 2:
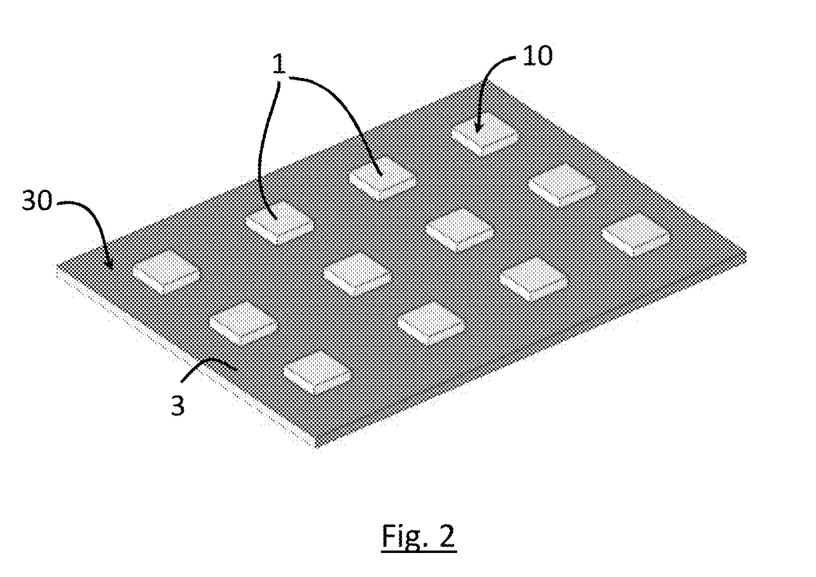
FIG. 2 is a perspective view of a plurality of chips disposed on a support in a situation before the start of one embodiment of the invention.

In this figure, it is noted that the channels 20 are defined above the material of the chip itself, with preferentially a bottom wall 24 formed by a portion of the face 10 of the chip 1, a top wall 26 and a double side wall 25; the following description given with reference to the manufacturing steps shown from FIG. 2 onwards explains how the side walls and top wall are defined.

FIG. 2 shows one example of the initial disposition of a plurality of chips 1 on a support 3, the second face of the chips, opposite the first face 10 thereof, being mounted on a first face 30 of the support 3. This support can be a substrate or an electrical connection base, for example an array of connection pads of the ball grid type (ball grid array, BGA).

Figure 3:
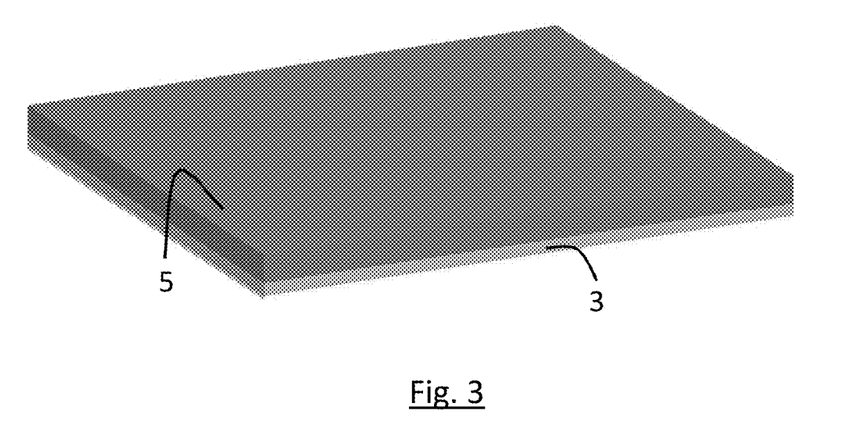
FIGS. 3 to 8 show successive steps that can be carried out in order to implement the invention.

On this base, in accordance with FIG. 3, the chips 1 can be encapsulated. In particular, an injection of an encapsulant product can be used, in particular a resin, and for example an epoxy resin. The overlay advantageously extends over the entirety of the first face 30 of the support 3 and advantageously entirely submerges the chips 1. The encapsulant product is then crosslinked so as to produce a stable and solid moulding in the form of an overlay layer denoted by the reference numeral 5.

Figure 4:
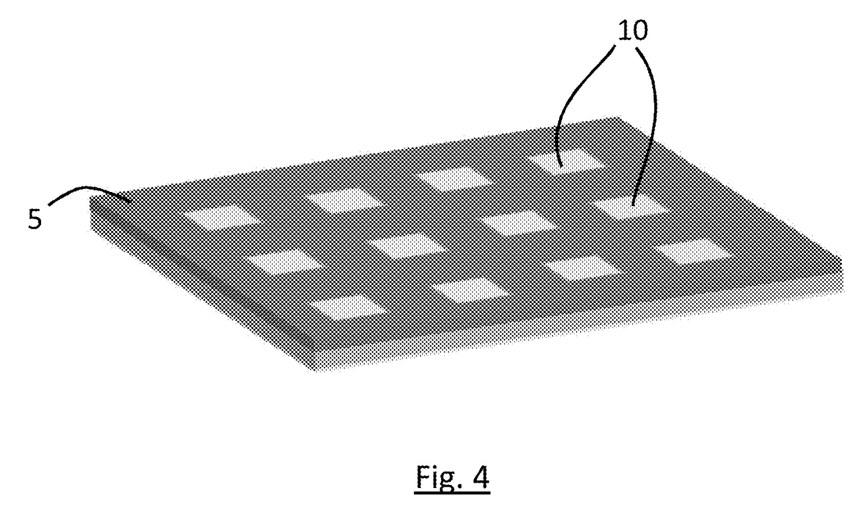

A thinning of the layer 5 allows the first faces 10 of the chips to be exposed. A planarisation technique can be used to carry out the thinning, in particular by grinding, stopping the abrasion when the first face 10 of the chips is reached. The result of this step, shown in FIG. 4, is advantageous insofar as a top surface of the overlay layer 5 is obtained which is planar and aligned with the first face 10 of the chips. This is seen to be useful for the formation of the cooling circuit. A physiognomy of the overlay layer 5, equivalent to that of FIG. 4, can be obtained by methods different to full overlay and thinning; in particular, moulding can also be carried out, whereby one part of the mould is placed in direct contact with the first face of the chips; they are thus not overlaid, but the moulding material surrounds same and overlays the first face 30 of the support.

On this base, patterns 4 can be created which allow the geometry of the cooling circuits 2 associated with the chips 1 to be defined. This is shown in the graphical representation in FIG. 5. At least one portion of the first face 10 of each chip is overlaid by a pattern, corresponding to the first pattern portion given the reference numeral 40. Another part of the patterns 4 corresponds to a second portion 41 extending on either side of the first portions 40 and in particular allowing the first portions 40 to be connected. In general, a first portion 40 forms a fluid passage circuit above the corresponding chip. It can comprise a plurality of channels 20, preferably parallel, the channels joining together at the ends thereof by fluid manifold parts. It is understood that a first manifold allows for fluid intake in the channels, whereas a second, preferably located opposite the first, provides for fluid output.

Figure 5:
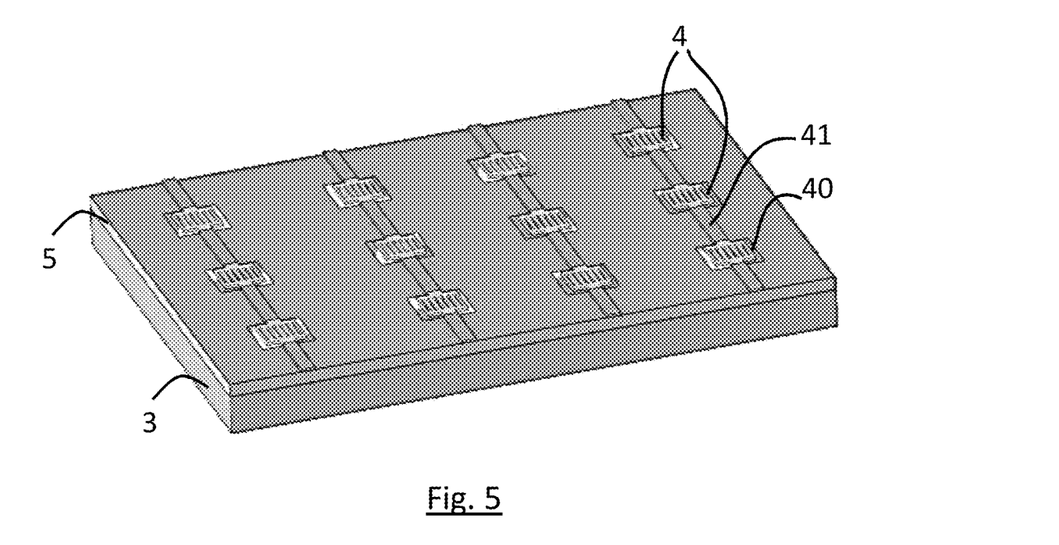

According to the invention, a sacrificial material is used to form, at least partially, a part of the thickness of the pattern. Thus, in another phase of the method, the removal of the sacrificial material will define, in the form of hollows, the cooling circuit.

In a first approach, the sacrificial material is removed by the melting thereof; in this context, materials having a relatively low melting point, preferably far from a degradation temperature of the chip are advantageously used. At the same time, the melting point is ideally higher than the curing temperature of the resins used for the coating. For example, metal materials, in particular alloys, can satisfy these conditions. Preferably, this can include alloy pastes adapted to screen printing, such as SnAg, SnAgCu, or SnZn, etc., for example an alloy comprising 96.5% tin and 3.5% silver providing a satisfactory melting point of about 225° C. Alloys with a lower melting point (120-200° C.) can also be cited, formed by a mixture of indium, tin and bismuth. These must be used with epoxy moulding resins at a lower crosslinking temperature (for example 80-120° C.).

In another approach, the sacrificial material is removed by the dissolution thereof; it is the fluid derived from the dissolution that removes the sacrificial material; in this context, use can be made of any material that is easily soluble without degrading the surrounding materials or making same soluble. Papermaking pulp, sugar, salt or even porous foams can be used.

The use of porous foams paves the way for numerous materials, including porous polymers and metal foams. The porosity allows for reduced etching durations compared to a solid material by facilitating the circulation of the chemical through the pores: solvent (for example acetone) for polymers and acid (for example aqua regia) for metals. The use of an encapsulating layer 43 for encapsulating the sacrificial material can, in such a case, also be used to isolate the etching chemical from the coating resin. In such a case, a method for depositing the layer 43 that is not or that is barely shaping is used, such as lamination so as not to take on the form of the pores. In the case wherein no encapsulating layer 43 is used, the sacrificial material is adapted to the coating resin. A coating resin is thus chosen to have a "filler" (commonly silica particles) size that is, where possible, greater than the size of the pores of the sacrificial material and a high viscosity so as not to fill the pores with resin.

The patterns 4 are formed as raised portions projecting above the first faces 10 of the chips 1 and the overlay layer 5. In particular, this does not involve portions hollowed out from the chips, meaning that there is no need to carry out photolithography and etching steps using silicon-type material in order to produce the channels of the invention.

In particular, methods of the screen printing type can be implemented. In particular, a drawn mask defines the desired pattern shapes. Printing with a screen printing paste is then carried out. 2D printing or 3D printing can also be implemented, or even electrochemical deposition (for example for metal materials). The 3D printing has the advantage of being able to produce a three-dimensional cooling circuit in a single step, whereas a plurality of mask levels and a plurality of encapsulations are required to produce the same three-dimensional circuit with a screen printing type method.

Figure 6:
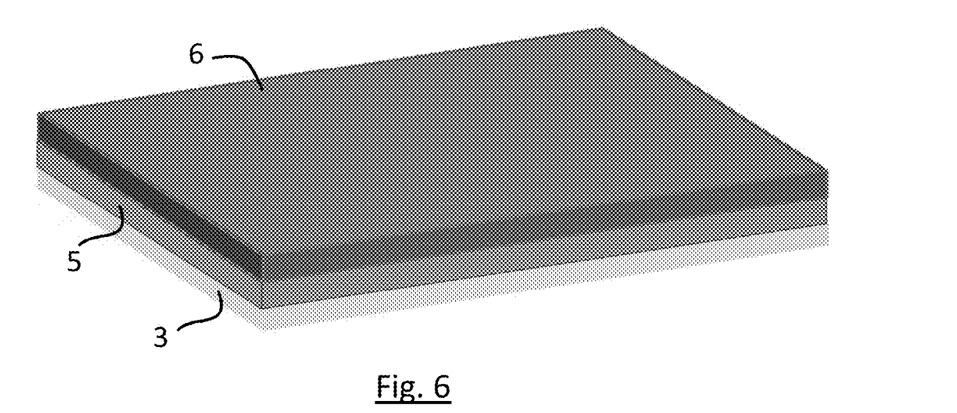

In the step corresponding to FIG. 6, a coating 6 is formed. Potentially, it is produced using a material that is equivalent to that of the overlay layer 5. The material used is preferentially a resin, for example an epoxy resin. The coating 6 is configured so as to overlay the entirety of the patterns 4 formed such that they overhang the top face of the overlay layer 5. By way of illustration, the thickness of the coating layer 6 can be greater than 10 μm, or even greater, for example more than 100 μm. The coating 6 can be produced in a similar manner to that described for the layer 5, whereby an injection of material in liquid resin form can be implemented, followed by crosslinking by annealing. Advantageously, the materials of the layer 5 and of the layer 6 will be merged so as to produce a coherent and one-piece assembly.

It should be noted that the coating 6 overlays the patterns while preferentially constituting a packaging layer for each chip.

Figure 7:
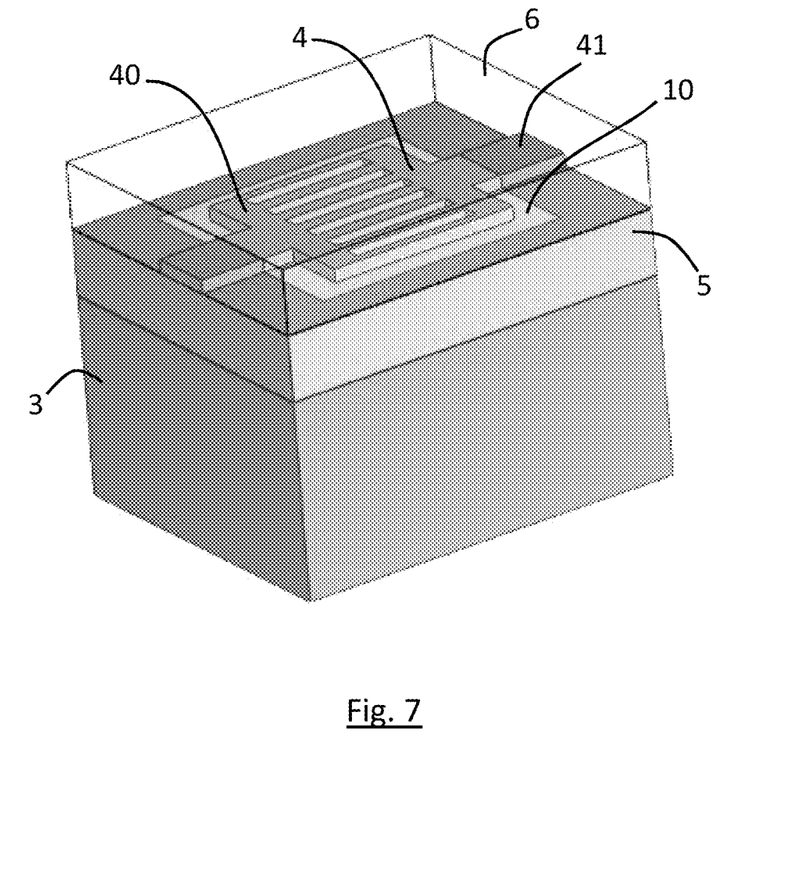

The chips 1 can then be separated, in particular by conventional dicing. Advantageously, dicing is carried out so as to expose parts that will be used as an inlet and outlet for the channels 20 of the cooling circuit 4. More specifically, FIG. 7 shows that a chip, with a corresponding portion of the support 3, of the overlay layer 5 and of the coating 6, has been separated from the others. The layer 6 is shown transparently so as to allow the underlying pattern 4 to appear. Parallel channels described hereinabove are present and the ends thereof join together at two fluid collection portions 40, 41, one whereof will be used at the fluid inlet and the other at the fluid outlet. The dicing here has been configured so as to expose, along the thickness of the coating 6, the edge of the first and second portions 40, 41.

An inlet and an outlet are thus obtained for removing the sacrificial material at least partially forming the pattern 4. Thus, the first inlet 40 can be connected by a pressurised liquid or gas pipe (for example nitrogen, in particular at a pressure that lies in the range 1 to 2 MPa, such as 1.4 MPa). Then, in the case of an embodiment implementing melting, heating is carried out, for example by placing the assembly comprising the chip in a furnace and by bringing it to above the melting point of the sacrificial material. In the case cited hereinabove using an alloy of tin and silver, a temperature of 250° C. is satisfactory. The injection of a fluid via the first portion 40 (or via the second 41) allows the molten sacrificial material to be propelled towards the second portion 41 (or the first 40), thus forming an outlet of the circuit for removing the sacrificial material. The latter can be recycled, in particular if this is a fusible metal. In particular, sacrificial materials can be chosen that have a melting temperature that lies in the range 200 to 240° C. In the option involving the removal of the sacrificial material by dissolution, an aqueous liquid solution can be fed in via the first portion 40, the sacrificial material can be gradually dissolved along the channels, and the solution can be drained via the second portion 41 for example.

Figure 8:
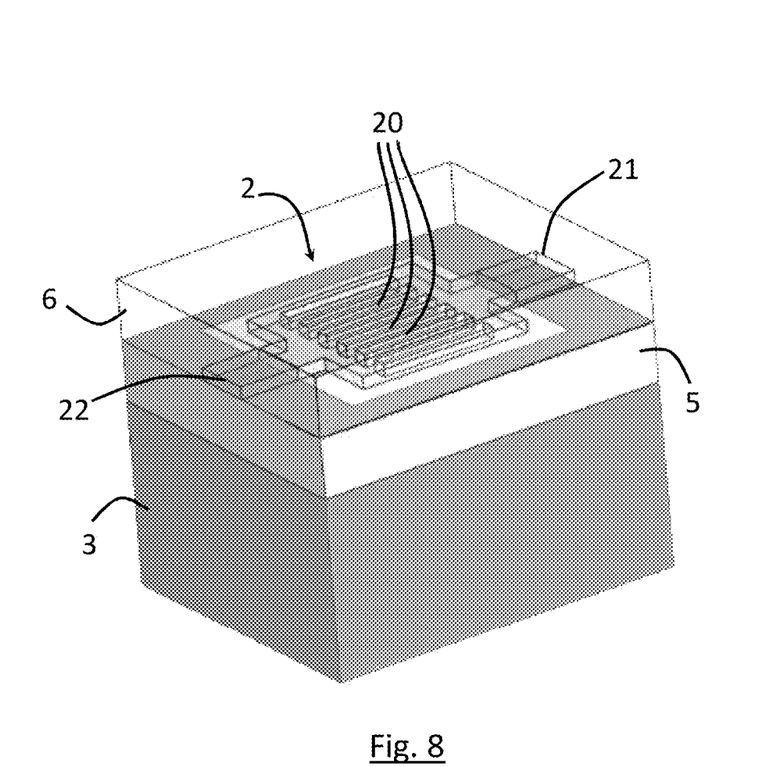

FIG. 8 shows the result of the removal of the sacrificial material, revealing, shown transparently through the coating layer 6, a cooling circuit 2 including, in the example, a plurality of channels 20, between a first aperture 21 and a second aperture 22. It is understood from the above description that the circuit 2 has a height, in the thickness dimension of the layers and of the chip, made by hollowing out the material of the coating 6. Thus, the invention is based on the excavation of the coating material, above the chip thanks to the sacrificial material.

It should be noted that not all of the sacrificial material must necessarily be removed. For example, a residual part of the sacrificial material can remain at at least one of the walls of the circuit 2. These residues can potentially increase the thermal conductivity of the circuit, or even protect the surrounding materials, and in particular the coating resin 6, from external attack, for example resulting from the coolant. However, removal must allow the cooling circuit to be opened, that is to say fluid communication to be provided between the first aperture 21 and the second aperture 22.

Figure 9:
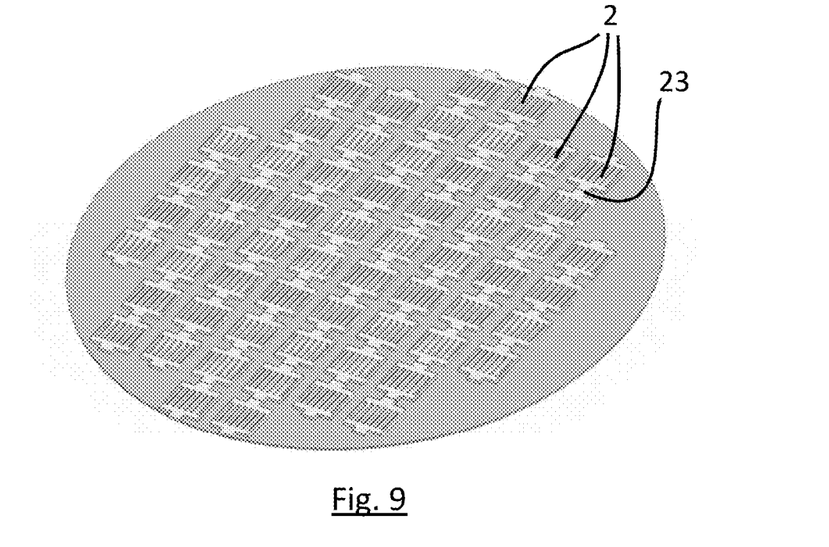
FIG. 9 shows a perspective view of the collective formation of a plurality of cooling circuits, each associated with a chip on the top surface of a support, such as a wafer-type substrate.

The embodiment corresponding to the sequence in FIGS. 2 to 8 relates to collective manufacture on the basis of a BGA-type support. The result shown in FIG. 8 can also be achieved by processing the chips individually. In the illustration shown in FIG. 9, a collective method has been produced for a plurality of chips 2 on the basis of a wafer-type substrate. Moreover, a separation zone 23 is shown, at which the singularisation of the chips further allows the ends of the first and second portions 40, 41 of the patterns to be opened, which will be used to form the apertures 21, 22. One alternative embodiment is possible, even in the absence of zones 41. The moulding is pierced by the layer 6 in order to achieve the pattern of the circuit by forming openings (at least one first opening for fluid intake and/or at least one second opening for output), for example at microchannel nozzles. The side walls are thus left whole and without cavities after dicing. The inlets and the outlets are thus advantageously vertical (along the thickness of the chip) in this scenario. They pass through the thickness of the coating 6 from end to end. In the case of removal by melting, at least one second opening can suffice, simply to remove the material in the liquid phase.

FIGS. 10a to 10e give another example configuration of the patterns 4 and of the method of the invention.

Figure 10A:
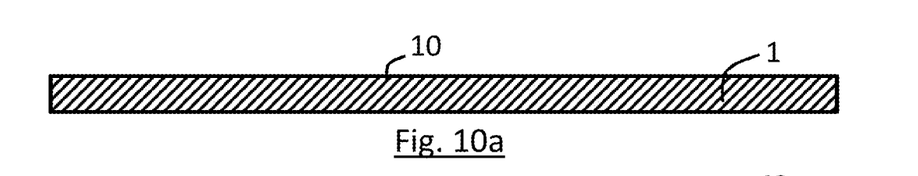
FIGS. 10a to 10e show one embodiment of the invention with a layer overlaying the channels.
Figure 10B:
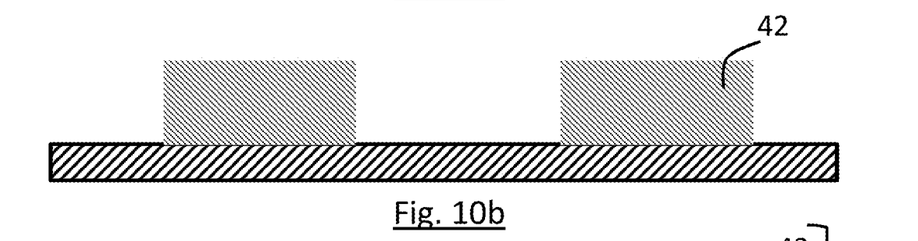

FIG. 10a diagrammatically shows a cross-section of a chip 1 at the first face 10 thereof. In FIG. 10b, the pattern parts have been built in the form of a layer 42 of a sacrificial material; the portions represented can correspond to the section of the two parts intended to form channels. It goes without saying that the layer 42 can be formed by a plurality of sub-layers deposited successively.

Figure 10C:
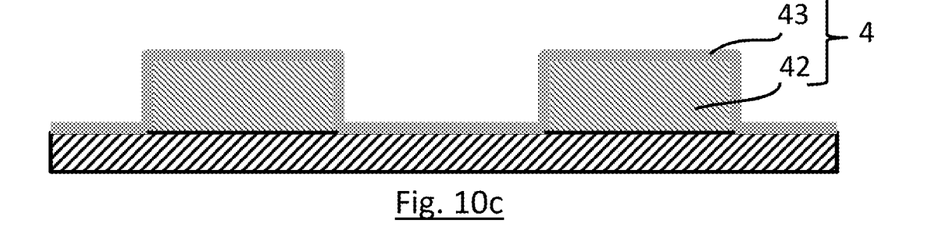

Then, a second layer 43 is formed so as to overlay the layer of sacrificial material 42, the set of layers forming the complete definition of the pattern 4. It goes without saying that the second layer 43 can be formed by a plurality of sub-layers deposited successively. In the case shown, the second layer 43 entirely overlays the layer 42, however this is not mandatory. Moreover, in the example shown, the layer 43 also overlays the first face 10 of the chip, outside the layer 42, however this is not mandatory.

For example, the second layer 43 can be deposited by chemical or physical vapour deposition techniques; the technique used will depend on the desired materials. The material of the layer 43 can be a better thermal conductor than the coating resin and/or a waterproof material.

Figure 10D:
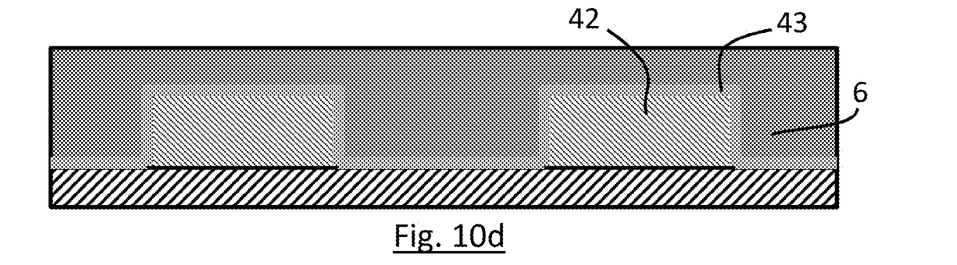
Figure 10E:
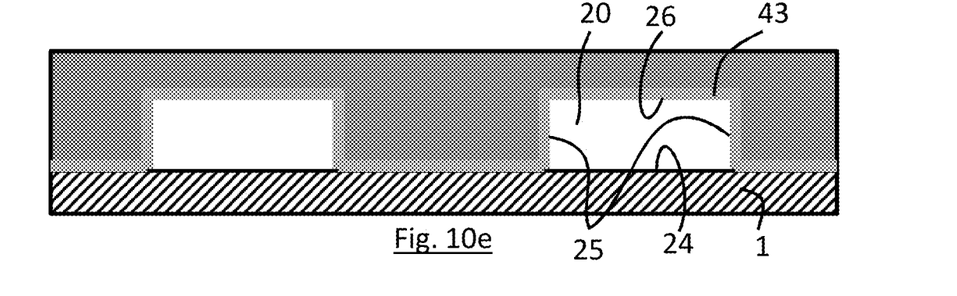

In FIG. 10d, the coating 6 is formed as described hereinabove. The latter is in contact with the second layer 43; advantageously, the sacrificial material of the layer 42 is isolated from the coating resin 6. As described hereinabove, the sacrificial material 42 is removed so as to produce an excavation within the volume of the coating 6; FIG. 10e shows the result thereof. In this instance, the side walls 25 and the top wall 26, in particular of the channels 20, correspond to the material of the second layer 43. As described hereinabove, the bottom wall 24 corresponds to the material of the first face 10 of the chip. It should be noted that the coating 6 overlays both the sides (directed with a non-zero component according to the thickness dimension of the substrate) and the tip of the patterns (which is the highest part of these patterns, which is, for example, a top face of the patterns, which can be planar and potentially parallel to the first face 10). The coating 6 forms a continuous and integral casing on either side of the pattern defined by the sacrificial material 42 above the first face 10.

In general, the second layer 43 can fulfil at least one of the following functions:
- increase thermal conduction between the substrate and the heat transfer fluid;
- act as an impervious barrier to prevent alteration or swelling of the moulding;
- act as a chemical barrier if a heat transfer fluid could react with the moulding;
- limit erosion of the walls of the moulding; and
- make the surface hydrophilic to prevent air/gas bubbles from remaining stuck to the wall during cooling if liquid.

According to another possibility, not shown, which can be combined with or implemented as an alternative to the embodiments corresponding to FIGS. 10a to 10e, a preliminary layer can be deposited before the formation of the layer of sacrificial material 42, so as to at least partially cover the first face 10 of the chip.

At the end of the process of the invention, the microelectronic device thus constituted on the basis of a chip 1 can be cooled by the circulation of a coolant, in particular a liquid, within the circuit 2.

For the phase involving the removal of the sacrificial material, one of the apertures 21, 22 can be assembled with a fluid intake pipe. For example, a capillary tube connected, in a sealed manner, to the corresponding aperture, can be installed. Advantageously, this pipe is conserved and reused for the coolant intake.

It should be noted that the section of the portions forming the cooling circuit 2 can be high; for example, the height of the channels can reach up to 50 microns, in particular between 50 and 150 microns; the width thereof is, in general, greater than 30 microns, or even greater than 50 microns, and in particular potentially lies in the range 50 to 1,000 microns. Such dimensions are achieved without altering or modifying the chips themselves.

REFERENCES

1. Chip
10. First face
2. Cooling circuit
20. Channel
21. First aperture
22. Second aperture
23. Separation zone
24. Bottom wall
25. Side wall
26. Top wall
3. Support
30. First face
4. Circuit definition pattern
40. First portion
41. Second portion
42. Layer of sacrificial material
43. Second layer
5. Overlay layer
6. Coating

The invention claimed is:

1. A method for manufacturing a cooling circuit on at least one integrated circuit chip, the method comprising:
   producing the cooling circuit on a first face of the at least one integrated circuit chip,
   wherein the producing comprises:
      forming a definition pattern of the cooling circuit located at least partially on the first face of the at least one integrated circuit chip, said definition pattern comprising at least one layer of a sacrificial material;
      forming a coating of said definition pattern by at least one resin layer, the coating being configured so as to overlay the definition pattern in its entirety; and
      at least partially removing the sacrificial material from said definition pattern so as to form a plurality of openings in the resin layer, each opening having a bottom side comprised by the first face, a top side comprised by the resin layer, and lateral sides joining the top and bottom sides comprised by the resin layer.

2. The method according to claim 1, wherein the at least partially removing comprises melting or dissolving the sacrificial material.

3. The method according to claim 2, further comprising forming at least one first opening through the coating configured so as to form an access to the definition pattern,
   wherein the at least partially removing comprises injecting a fluid via the at least one first opening, and/or
   the at least partially removing comprises forming at least one second opening through the coating configured so as to form an access to the definition pattern, the at least partially removing comprising expelling the sacrificial material via the at least one second opening.

4. The method according to claim 2, wherein the cooling circuit comprises a first aperture and a second aperture, and
   the at least partially removing further comprises injecting a fluid via the first aperture and expelling the sacrificial material via the second aperture.

5. The method according to claim 2, wherein the at least partially removing comprises melting the sacrificial material and
   the sacrificial material is a metallic material.

6. A method for manufacturing a cooling circuit on at least one integrated circuit chip, the method comprising:
producing the cooling circuit on a first face of the at least one integrated circuit chip,
wherein the producing comprises:
forming a definition pattern of the cooling circuit located at least partially on the first face of the at least one integrated circuit chip, said definition pattern comprising at least one layer of a sacrificial material, and
forming a coating of said definition pattern by at least one resin layer, the coating being configured so as to overlay the definition pattern in its entirety, wherein
forming said definition pattern comprises forming the at least one layer of the sacrificial material on the first face of the at least one integrated circuit chip and forming at least one second layer on the at least one layer of the sacrificial material, and
the at least one second layer is configured such that the at least one second layer is not removed during the at least partially removing, and
at least partially removing the sacrificial material from said definition pattern so as to form a plurality of openings, each opening having a bottom side comprised by the first face and a top side and lateral sides joining the top and bottom sides comprised by the second layer.

7. The method according to claim 1, wherein
forming said definition pattern comprises forming at least one preliminary layer on the at least one integrated circuit chip to form the first face, and forming the at least one layer of the sacrificial material on the at least one preliminary layer, and
the at least one preliminary layer is configured such that the at least one preliminary layer is not removed during the at least partially removing.

8. The method according to claim 1, further comprising assembling the at least one integrated circuit chip, via a second face of the at least one integrated circuit chip opposite the first face of the at least one integrated circuit chip, on a first face of a support before producing the cooling circuit.

9. The method according to claim 8, further comprising forming an overlay layer on the first face of the support configured such that only the first face of the at least one integrated circuit chip is left exposed.

10. The method according to claim 1, wherein the forming said definition pattern comprises forming a first pattern portion on the first face of the at least one integrated circuit chip and forming a second pattern portion on an area adjacent to the first face of the at least one integrated circuit chip.

11. The method according to claim 8, wherein the assembling the at least one integrated circuit chip is assembling a plurality of integrated circuit chips.

12. The method according to claim 11, wherein the forming said definition pattern comprises forming a first pattern portion on the first face of the at least one integrated circuit chip and forming a second pattern portion on an area adjacent to the first face of the at least one integrated circuit chip, and
wherein the forming the second pattern portion is configured so as to connect two first pattern portions associated with different chips of the plurality of the integrated circuit chips.

13. The method according to claim 12, further comprising separating portions of the support each comprising the at least one integrated circuit chip of the plurality of integrated circuit chips, after forming the coating and before the at least partially removing the sacrificial material.

14. The method according to claim 13, wherein the separating is configured so as to cut the second pattern portions so as to produce a first aperture and/or a second aperture of the at least one integrated circuit chip of the plurality of the integrated circuit chips.

* * * * *